(12) United States Patent
Liu et al.

(10) Patent No.: US 9,378,818 B2
(45) Date of Patent: Jun. 28, 2016

(54) APPARATUSES AND OPERATION METHODS ASSOCIATED WITH RESISTIVE MEMORY CELL ARRAYS WITH SEPARATE SELECT LINES

(71) Applicant: Micron Technology, Inc., Boise, ID (US)

(72) Inventors: Zengtao T. Liu, Boise, ID (US); Kirk D. Prall, Boise, ID (US); Mike Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 14/185,095

(22) Filed: Feb. 20, 2014

(65) Prior Publication Data

US 2014/0233300 A1  Aug. 21, 2014

Related U.S. Application Data

(62) Division of application No. 13/293,353, filed on Nov. 10, 2011, now Pat. No. 8,681,529.

(51) Int. Cl.
*G11C 11/00* (2006.01)
*G11C 13/00* (2006.01)
(Continued)

(52) U.S. Cl.
CPC ............ *G11C 13/0069* (2013.01); *G11C 11/56* (2013.01); *G11C 13/0002* (2013.01); *G11C 13/003* (2013.01); *G11C 13/004* (2013.01); *G11C 5/063* (2013.01); *G11C 8/14* (2013.01);
(Continued)

(58) Field of Classification Search
CPC ...................................................... G11C 11/00

USPC ............ 365/46, 94, 100, 129, 148, 158, 163; 257/2–5, 9, 310, E21.35, E31.047, 257/E27.006; 438/95, 96, 135, 166, 240, 438/365, 482, 486, 597, 785; 977/754
See application file for complete search history.

(56) References Cited

U.S. PATENT DOCUMENTS 4,876,668 A * 10/1989 Thakoor et al. ................ 365/163
6,208,575 B1 * 3/2001 Proebsting ..................... 365/208
(Continued)

FOREIGN PATENT DOCUMENTS

EP      1852873 A1      11/2007

OTHER PUBLICATIONS

International Search Report and Written Opinion of related international application No. PCT/US2012/064478, dated Mar. 25, 2013, 9 pp.

(Continued)

*Primary Examiner* — Harry W Byrne
(74) *Attorney, Agent, or Firm* — Brooks, Cameron & Huebsch, PLLC (57) ABSTRACT

The present disclosure includes methods and apparatuses that include resistive memory. A number of embodiments include a first memory cell coupled to a data line and including a first resistive storage element and a first access device, a second memory cell coupled to the data line and including a second resistive storage element and a second access device, an isolation device formed between the first access device and the second access device, a first select line coupled to the first resistive storage element, and a second select line coupled to the second resistive storage element, wherein the second select line is separate from the first select line.

20 Claims, 5 Drawing Sheets

(51) Int. Cl.
*G11C 11/56* (2006.01)
*G11C 5/06* (2006.01)
*G11C 8/14* (2006.01)
*H01L 27/22* (2006.01)
*H01L 27/24* (2006.01)

(52) U.S. Cl.
CPC ........ *G11C 2213/74* (2013.01); *G11C 2213/78* (2013.01); *G11C 2213/79* (2013.01); *H01L 27/222* (2013.01); *H01L 27/24* (2013.01)

(56) References Cited

U.S. PATENT DOCUMENTS

| | | | |
|---|---|---|---|
| 6,606,263 | B1 | 8/2003 | Tang |
| 7,145,795 | B2 | 12/2006 | Ghodsi |
| 7,149,100 | B2 | 12/2006 | Nazarian |
| 7,505,348 | B2* | 3/2009 | De Brosse et al. ............ 365/214 |
| 7,606,055 | B2 | 10/2009 | Liu |
| 7,890,892 | B2* | 2/2011 | De Brosse et al. ............. 365/81 |
| 2004/0100814 | A1 | 5/2004 | Hsu |
| 2006/0024886 | A1* | 2/2006 | Ferrant et al. ................. 438/257 |
| 2006/0139989 | A1 | 6/2006 | Gruning Von Schwerin et al. |
| 2007/0279962 | A1 | 12/2007 | Nirschl et al. |
| 2008/0084734 | A1* | 4/2008 | De Brosse et al. ............ 365/163 |
| 2008/0258129 | A1* | 10/2008 | Toda ................................ 257/5 |
| 2009/0014703 | A1 | 1/2009 | Inaba |
| 2009/0129195 | A1* | 5/2009 | De Brosse et al. ....... 365/230.06 |
| 2010/0295009 | A1* | 11/2010 | Lung et al. ........................ 257/2 |
| 2011/0063902 | A1 | 3/2011 | Lung |
| 2011/0096588 | A1 | 4/2011 | Fasoli |
| 2011/0216580 | A1 | 9/2011 | Berger et al. |
| 2012/0287706 | A1* | 11/2012 | Lung ............................. 365/163 |

OTHER PUBLICATIONS

Office Action for related Taiwan Patent Application No. 101141933, dated Feb. 11, 2015, 12 pages.

* cited by examiner

| | TARGET WORD LINE | TARGET SELECT LINE | TARGET BIT LINE | ADJACENT WORD LINE | ISOLATION WORD LINE | ADJACENT SELECT LINE | UNSELECTED BIT LINE | UNSELECTED WORD LINE | UNSELECTED ISOLATION WORD LINE |
|---|---|---|---|---|---|---|---|---|---|
| 320-1 READ_1 | Vcc | Vread | GND | GND | GND | GND | Vread | GND | GND |
| 320-2 READ_2 | Vcc | GND | Vread | GND | GND | GND | GND | GND | GND |
| 322-1 SET_1 | Vhigh | Vset | GND | GND | GND | GND | Vset | GND | GND |
| 322-2 SET_2 | Vhigh | Vset | GND | Vhigh | Vhigh | 1/2 Vset | 1/2 Vset | GND | GND |
| 322-3 SET_3 | Vhigh | Vset | GND | Vhigh | Vhigh | 1/3 Vset | 2/3 Vset | GND | GND |
| 324-1 RESET_1 | Vhigh | GND | Vreset | GND | GND | GND | GND | GND | GND |
| 324-2 RESET_2 | Vhigh | GND | Vreset | Vhigh | Vhigh | 1/2 Vreset | 1/2 Vreset | GND | GND |
| 324-3 RESET_3 | Vhigh | GND | Vreset | Vhigh | Vhigh | 2/3 Vreset | 1/3 Vreset | GND | GND |

APPARATUSES AND OPERATION METHODS ASSOCIATED WITH RESISTIVE MEMORY CELL ARRAYS WITH SEPARATE SELECT LINES

PRIORITY INFORMATION

This application is a divisional of U.S. application Ser. No. 13/293,353, filed Nov. 10, 2011, which is incorporated by reference.

TECHNICAL FIELD

The present disclosure relates generally to semiconductor memory and methods, and more particularly, to apparatuses and operation methods associated with resistive memory cell arrays with separate select lines.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), resistive random access memory (RRAM), magnetoresistive random access memory (MRAM; also referred to as magnetic random access memory), and conductive-bridging random access memory (CBRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistive memory such as RRAM includes resistive memory cells that can store data based on the resistance state of a storage element (e.g., a resistive storage element having a variable resistance). As such, resistive memory cells can be programmed to a desired data state by varying the resistance level of the resistive storage element. Resistive memory cells can be programmed to a desired data state (e.g., corresponding to a particular resistance state) by applying sources of energy, such as positive or negative electrical pulses (e.g., positive or negative voltage and/or current pulses) to the cells (e.g., to the resistive storage element of the cells) for a particular duration.

One of a number of data states (e.g., resistance state) can be set for a resistive memory cell. For example, a single level cell (SLC) may be programmed to one of two data states (e.g., logic 1 or 0), which can depend on whether the cell is programmed to a resistance above or below a particular level. As an additional example, various resistive memory cells can be programmed to multiple different resistance states corresponding to multiple data states. Such cells may be referred to as multi state cells, multi-digit cells, and/or multilevel cells (MLCs), and can each store data having values of multiple binary digits (e.g., 10, 01, 00, 11, 111, 101, 100, 1010, 1111, 0101, 0001, etc.).

Some arrays of resistive memory cells can include a one transistor one resistor (1T1R) architecture in which each memory cell includes one access device and one resistive storage element. In such 1T1R architectures, adjacent resistive storage elements can be electrically separated from each other using shallow trench isolation (STI). In some 1T1R architectures, isolation transistors can be used to selectively electrically separate adjacent resistive storage elements (e.g., instead of STI).

DETAILED DESCRIPTION

The present disclosure includes methods and apparatuses that include resistive memory. A number of embodiments include a first memory cell coupled to a data line and including a first resistive storage element and a first access device, a second memory cell coupled to the data line and including a second resistive storage element and a second access device, an isolation device formed between the first access device and the second access device, a first select line coupled to the first resistive storage element, and a second select line coupled to the second resistive storage element, wherein the second select line is separate from the first select line.

A number of embodiments of the present disclosure can provide for an increase in current drive to a targeted cell (e.g., during a set and/or reset operation) as compared to previous approaches. A number of embodiments include an array of resistive memory cells having a 1.5T1R architecture. A 1.5T1R architecture can provide, for example, a 6F2 cell size, which can be the same as various 1T1R architectures. In a number of embodiments, an array having a 1.5T1R architecture can be operated in multiple modes (e.g., in a 1T1R mode or in a 1.5T1R mode).

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory cells can refer to one or more memory cells. Additionally, the designators, such as "M" and/or "N" for example, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1A, and a similar element may be referenced as 204 in FIG. 2A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1A:
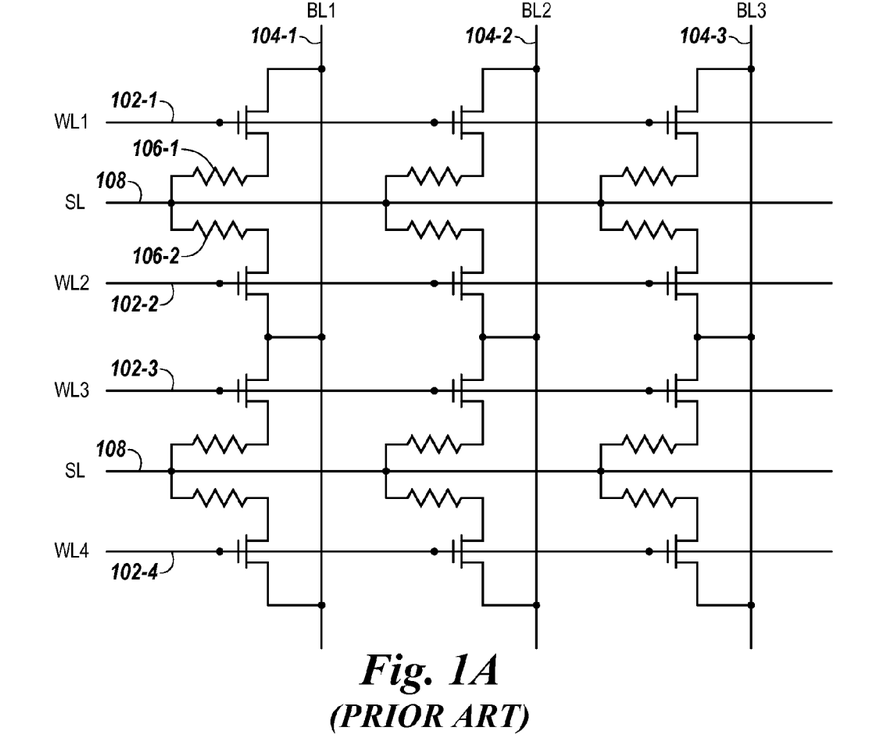
FIG. 1A is schematic of a portion of an array of resistive memory cells in accordance with the prior art.

FIG. 1A is schematic of a portion an array of resistive memory cells in accordance with the prior art. The array shown in FIG. 1A has a 1T1R architecture. That is, each memory cell of the array shown in FIG. 1A includes one access device (e.g., one transistor as shown) and one resistive storage element (e.g., one resistor as shown). The array shown in FIG. 1A includes a number of data lines, which may be referred to herein as bit lines 104-1 (BL1), 104-2 (BL2), and 104-3 (BL3). The array shown in FIG. 1A also includes a number of access lines, which may be referred to herein as word lines 102-1 (WL1), 102-2 (WL2), 102-3 (WL3), and 102-4 (WL4). The word lines 102-1 to 102-4 are coupled to the gates of the access devices (shown as transistors) of the resistive memory cells along a particular "row" and the bit lines 104-1 to 104-3 are coupled to a source/drain region of the access devices along a particular "column." The array illustrated in FIG. 1A also includes select lines 108 coupled to the resistive storage elements of adjacent memory cells. In this example, the select line 108 can be common to the entire array.

Figure 1B:
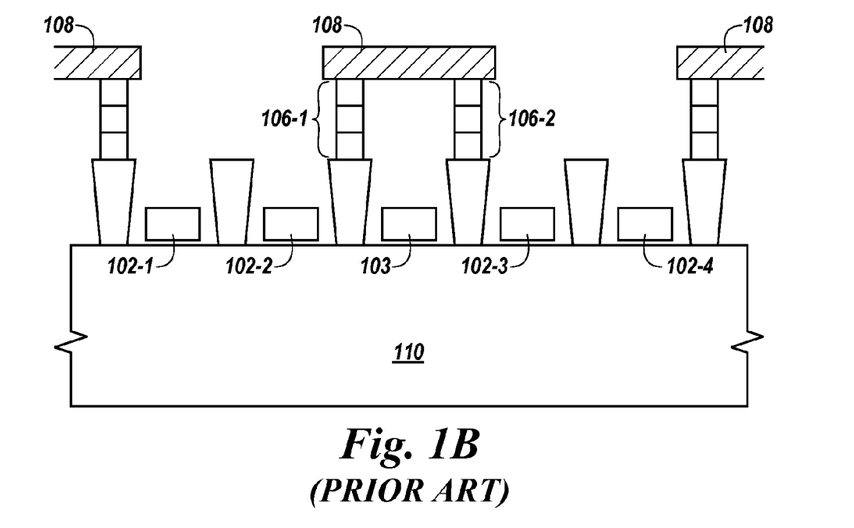
FIG. 1B illustrates a cross-sectional view of a portion of the prior art array of resistive memory cells shown in FIG. 1A.

The memory cells of the array shown in FIG. 1A can be operated by applying particular signals (e.g., voltage signals) to the word lines, bit lines, and select lines. As an example, a target cell can be selected, for instance, by activating (e.g., turning on) the access device associated with the target cell (e.g., by applying a supply voltage such as Vcc to the word line to which the target cell is coupled). A voltage difference between the bit line and select line associated with the target cell can result in current flow through the resistive storage element of the target cell (e.g., during a set operation, reset operation, or read operation). As an example, current and/or voltage on the bit line of a target cell can be sensed (e.g., responsive to a read voltage applied to the bit line of the target cell and a ground voltage applied to the select line of the target cell) in order to determine the data state of the target cell (e.g., in a read operation). As shown in FIG. 1B, the array shown in FIG. 1A can include isolation devices (coupled to isolation lines), which can serve to selectively electrically separate adjacent resistive storage elements and which are deactivated (e.g., turned off via a ground voltage) during memory cell operations.

FIG. 1B illustrates a cross-sectional view of a portion of the prior art array of resistive memory cells shown in FIG. 1A. FIG. 1B illustrates a number of access devices formed in a substrate 110. In this example, the number of access devices are transistors having their gates coupled to respective word lines 102-1, 102-2, 102-3, 102-4. As illustrated in FIG. 1B, an isolation device (e.g., transistor) is also formed in the substrate 110 and has its gate coupled to an isolation line 103. In this example, resistive storage elements 106-1 and 106-2 are separated by the isolation device. The array shown in FIGS. 1A and 1B can include an isolation device formed between each pair of resistive storage elements (e.g., 106-1 and 106-2).

As noted above, the select line 108 is common to the entire array. As such, a voltage signal applied to select line 108 is applied to each of the memory cells of the array (e.g., via the respective resistive storage elements to which the common select line 108 is coupled). Also as noted above, during operation of the memory cells shown in the array of FIGS. 1A and 1B, the isolation word lines (e.g., 103) remain unbiased (e.g., grounded) such that the isolation transistors remain deactivated during memory cell operations.

The example of FIGS. 1A and 1B illustrates a transistor-side (T-side) bit line 1T1R architecture (e.g., the access devices are directly coupled to the bit lines and the resistive storage elements are directly coupled to the select line). However, as one of ordinary skill in the art will appreciate, the array could be a resistor-side (R-side) bit line 1T1R architecture (e.g., the resistive storage elements are directly coupled to the bit lines and the access devices are directly coupled to the select lines). As an example the array architecture shown in FIGS. 1A and 1B can have a $6F^2$ cell size.

Figure 2A:
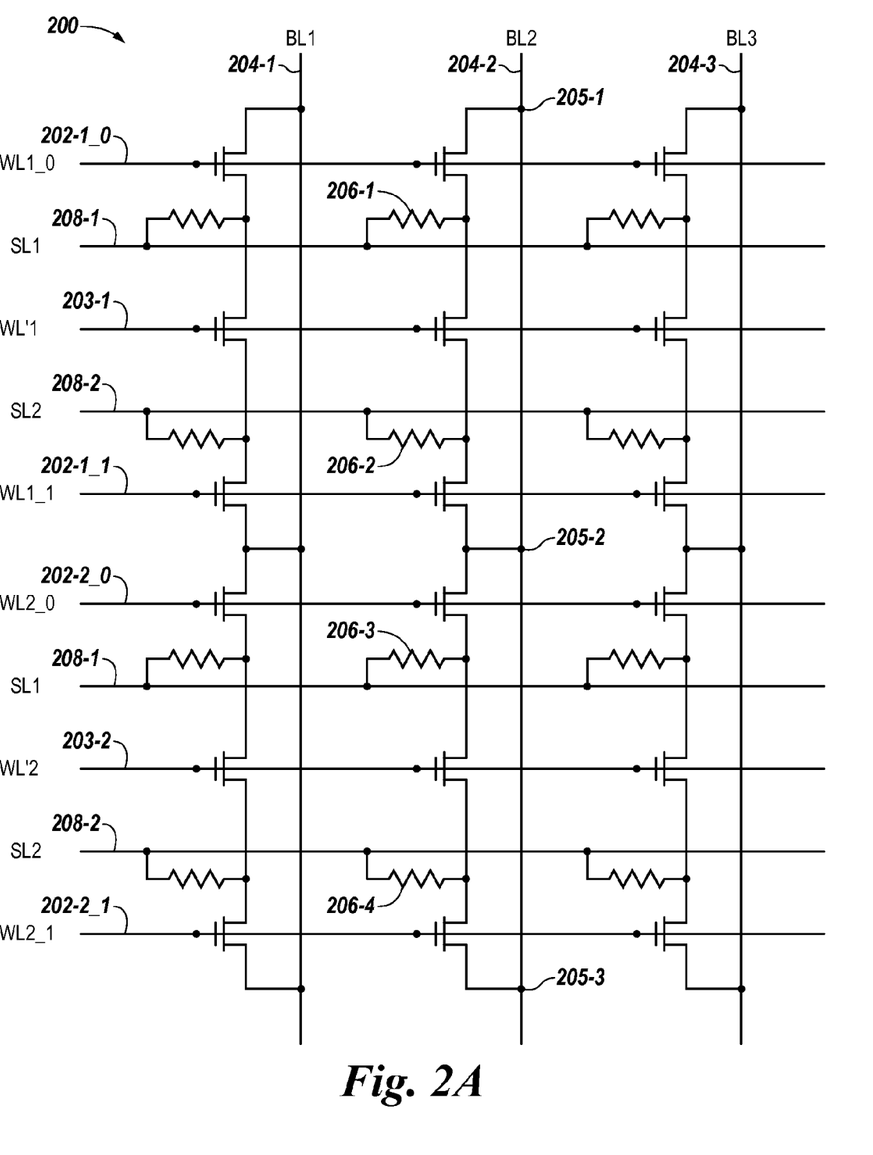
FIG. 2A is a schematic of a portion of an array of resistive memory cells in accordance with a number of embodiments of the present disclosure.

FIG. 2A is a schematic of a portion of an array of resistive memory cells in accordance with a number of embodiments of the present disclosure. The array in FIG. 2A includes a number of data lines, which may be referred to herein as bit lines 204-1 (BL1), 204-2 (BL2), and 204-3 (BL3). The array in FIG. 2A also includes a number of access lines, which may be referred to herein as word lines 202-1_0 (WL1_0), 202-1_1 (WL1_1), 202-2_0 (WL2_0), and 202-2_1 (WL2_1). The word lines 202-1_0, 202-1_1, 202-2_0, and 202-2_1 are coupled to the gates of the access devices (shown as transistors) of the resistive memory cells along a particular "row" and the bit lines 204-1, 204-2, and 204-3 are coupled to a source/drain region of the access devices along a particular "column." The array in FIG. 2A also includes select line 208-1 (SL1) and select line 208-2 (SL2) coupled to the resistive storage elements of adjacent memory cells (e.g., 206-1 and 206-2). The select lines 208-1 and 208-2 are configured so that different signals can be applied to each select line (e.g., select lines 208-1 and 208-2 are physically separate lines). The array in FIG. 2A also includes a number of isolation lines, which may be referred to herein as isolation lines 203-1 (WL'1) and 203-2 (WL'2). The isolation lines 203-1 and 203-2 are coupled to the gates of the isolation devices (shown as transistors) of the resistive memory cells along a particular "row" and the resistive storage elements (shown as resistors) are coupled to a source/drain region of the isolation devices.

The array in FIG. 2A has a 1.5T1R architecture. For instance each memory cell of the array in FIG. 2A includes one access device, one resistive storage element, and an isolation device, which is shared by the memory cell and an adjacent memory cell of the array. Therefore, each pair of memory cells is associated with three devices and two resistive storage elements, with each memory cell of the pair including an access device and a shared isolation device, as well as a resistive storage element. Isolation devices and access devices can be planar transistors, recessed transistors, FinFETs and/or vertical FETs, among other devices. Adjacent memory cells that share an isolation device are formed between adjacent bit line contacts (e.g., 205-1 and 205-2). For example, in FIG. 2A, the memory cell including resistive storage element 206-1 and the memory cell including resistive storage element 206-2, which are formed between bit line contacts 205-1 and 205-2, share the isolation device coupled to isolation line 203-1 and each of the memory cells. The resistive memory cells in FIG. 2A can have a $6F^2$ cell size.

Resistive memory cells in FIG. 2A can include a resistive storage element, such as resistive storage element 206-1, and an access device, such as the access device at the intersection of word line 202-1_0 and bit line 204-2. The access device can be a transistor or a diode (e.g., a field effect transistor (FET) or bipolar junction transistor (BJT), among other access devices). The resistive storage element can include a programmable portion that may have a variable resistance, for example. For instance, the resistive storage element can include one or more resistance variable materials (e.g., a material programmable to multiple different resistance levels, which can represent multiple different data states) such as, for example, a transition metal oxide material or a perovskite including two or more metals (e.g., transition metals, alkaline earth metals, and/or rare earth metals). Other examples of resistance variable materials that can be included in the resistive storage element of resistive memory cells can include various materials employing trapped charges to modify or alter conductivity, chalcogenides formed of various doped or undoped materials, binary metal oxide materials, colossal magnetoresistive materials, and/or various polymer based resistive variable materials, among others. However, embodiments are not limited to a particular resistance variable material or materials. As such, resistive memory cells can be single level and/or multilevel resistive random access memory (RRAM) cells, programmable conductor memory cells, phase change random access memory (PCRAM) cells, magnetoresistive random access memory (MRAM; also referred to as magnetic random access memory) cells, and/or conductive-bridging random access memory (CBRAM) cells, among various other types of resistive memory cells.

In one or more embodiments, signals (e.g. voltage signals) can be applied to the resistive memory cells in the array 200 of FIG. 2A. Although application of voltage signals is referred to in connection with operating memory cells in a number of embodiments, application of current signals can also be used to operate the resistive memory cells. The signals can be part of a set and/or reset operation used to program the resistive memory cells to a resistance state corresponding to a target data state and/or part of a read operation that is used to determine the data state of the cell. For example, a set operation can be used to program a resistive memory cell from a high resistance reset state to a low resistance set state or to one of a number of intermediate resistance states between the reset state and the set state. A reset operation can be used to program a resistive memory cell from the low resistance set state to the high resistance reset state or to one of a number of intermediate resistance states between the set state and the reset state.

In a number of embodiments, when a resistive memory cell of a pair of resistive memory cells is targeted during an operation performed on an array of resistive memory cells, the word line and access device associated with the target resistive memory cell can be referred to as the target word line and the target access device, respectively. The word line and access device associated with the non-targeted resistive memory cell of the pair can be referred to as the adjacent word line and the adjacent access device, respectively.

The memory cells of the array in FIG. 2A can be operated by applying particular signals to the word lines, bit lines, and select lines. As an example, a target cell, such as the cell including resistive storage element 206-2 (e.g., the cell coupled to word line 202-1_1 and bit line 204-2), can be selected, for instance, by activating (e.g., turning on) the access device of the target cell (e.g., by applying an activation voltage such as Vhigh to the word line to which the target cell is coupled (e.g., word line 202-1_1)). A voltage difference between the bit line of the target cell (e.g., bit line 204-2) and the select line of the target cell (e.g., select line 208-2) can result in current flow through the resistive storage element (e.g., 206-2) of the target cell in association with a set operation, a reset operation, or a read operation. Also, performing an operation on the target cell can include applying particular signals to the isolation line of the target cell (e.g., isolation line 203-1) in order to activate or deactivate the isolation access device as appropriate. When performing an operation on the target cell in a 1.5T1R mode (e.g., a set operation and/or a reset operation), the isolation device as well as the access device of the cell adjacent to the target cell are activated and a voltage difference between the bit line (e.g., bit line 204-2) and select line (e.g., select line 208-2) associated with the target cell can result in additional current flow through the resistive storage element (e.g., resistive storage element 206-2) of the target cell through the path of the adjacent bit line contact (e.g., 205-1), the access device of the adjacent cell, and the isolation device, connected in series. This additional conduction path can increase the current drive associated with the operation performed on the target cell. Some signals are applied to the select line associated with the cell adjacent to the target cell (e.g., select line 208-1) and the unselected bit lines (e.g., bit lines 204-1 and 204-3) during 1.5T1R mode of operations to mitigate the possible disturb to the resistive storage elements of non-target cells (e.g., resistive storage element 206-1).

Figure 2B:
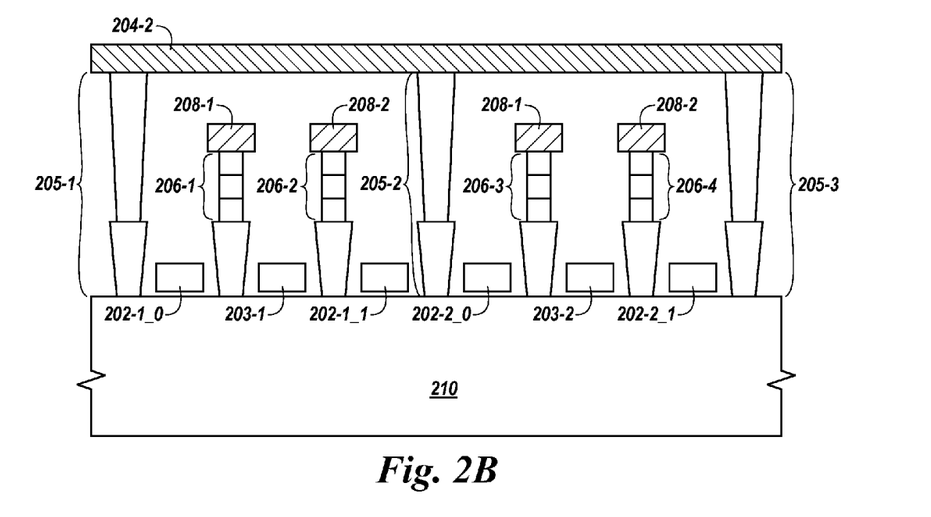
FIG. 2B illustrates a cross-sectional view of a portion of an array of resistive memory cells in accordance with a number of embodiments of the present disclosure.

FIG. 2B illustrates a cross-sectional view of a portion of an array of resistive memory cells in accordance with a number of embodiments of the present disclosure. FIG. 2B illustrates a number of devices formed in a substrate 210. The access devices formed in substrate 210 can be planar access devices formed concurrently. In FIG. 2B, the number of access devices are transistors having their gates coupled to respective word lines 202-1_0, 202-1_1, 202-2_0, 202-2_1. As illustrated in FIG. 2B, isolation devices (e.g., transistors) are also formed in the substrate 210 and have their gates coupled to isolation lines 203-1 and 203-2. Resistive storage elements 206-1 and 206-2 are selectively electrically separated by an isolation device coupled to isolation line 203-1 and resistive storage elements 206-3 and 206-4 are selectively electrically separated by an isolation device coupled to isolation line 203-2. The array shown in FIGS. 2A, 2B, and 2C can include an isolation device formed between each pair of resistive storage elements (e.g., 206-1 and 206-2).

In FIG. 2B, select lines 208-1 and 208-2 are physically separate conductive lines such that they can be operated independently of each other. One memory cell of a pair of memory cells formed between adjacent bit line contacts (e.g., 205-1 and 205-2) is coupled to one of the select lines (e.g., 208-1) and the other memory cell of the pair is coupled to the other select line (e.g., 208-2). For instance, resistive storage element 206-1 is coupled to select line 208-1 and resistive storage element 206-2 is coupled to select line 208-2. In a number of embodiments, during operation of the memory cells in the array of FIGS. 2A, 2B, and 2C, the isolation lines (e.g., 203-1 and 203-2) can have a voltage applied to them such that the isolation devices are activated during memory cell operation and/or can be unbiased (e.g., grounded) such that an isolation device is deactivated during memory cell operations.

FIG. 2B also illustrates that the bit lines of array 200 (e.g., bit line 204-2 as shown) can be formed above the resistive storage elements 206-1, 206-2, 206-3, and 206-4 and select lines 208-1 and 208-2 in the array 200.

Figure 2C:
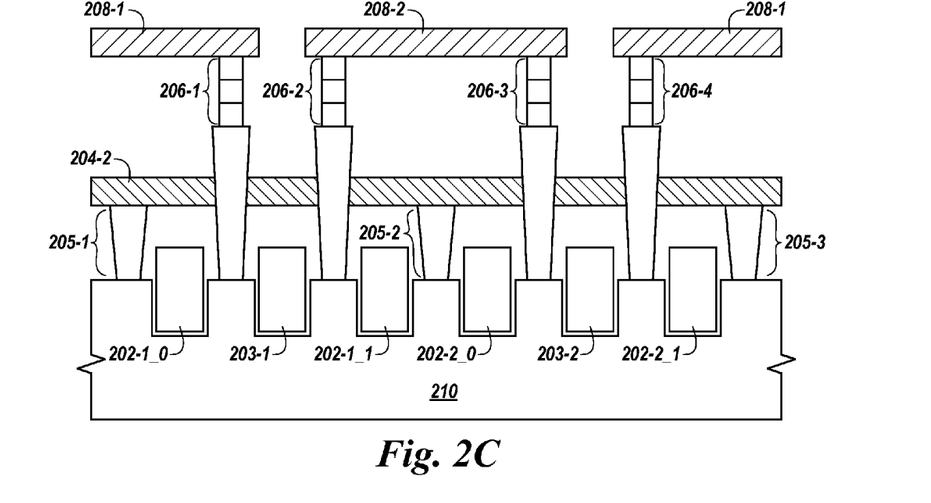
FIG. 2C illustrates a cross-sectional view of a portion of an array of resistive memory cells in accordance with a number of embodiments of the present disclosure.

FIG. 2C illustrates a cross-sectional view of a portion of an array of resistive memory cells in accordance with a number of embodiments of the present disclosure. FIG. 2C is similar to the embodiment illustrated in FIG. 2B. However, in FIG. 2C the access devices coupled to word lines 202-1_0, 202-1_1, 202-2_0, and 202-2_1 are concurrently formed recessed transistors. Also, in FIG. 2C, the bit line 204-2 is formed below the resistive storage elements 206-1, 206-2, 206-3, and 206-4 and the select lines 208-1 and 208-2.

Figure 3:
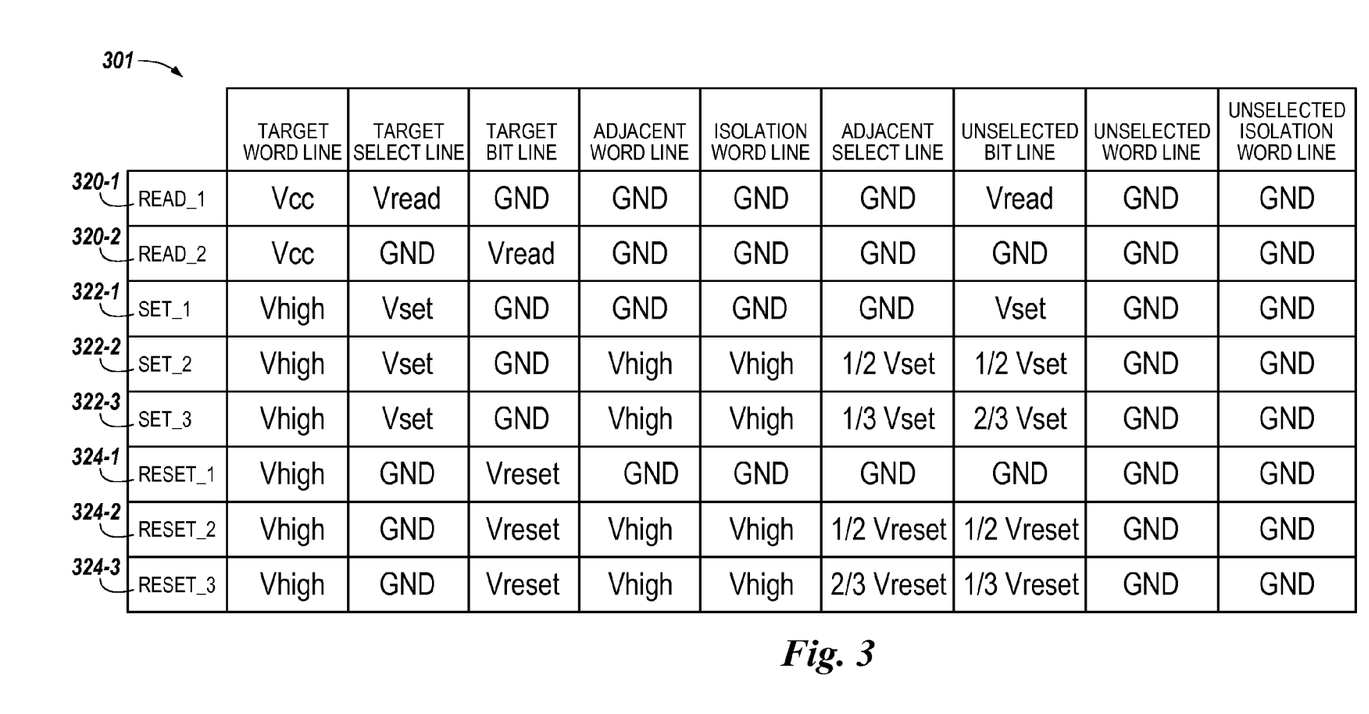
FIG. 3 is a table illustrating operation parameters associated with operating an array of resistive memory cells in accordance with a number of embodiments of the present disclosure.

FIG. 3 is a table 301 illustrating operation parameters (e.g., voltages) associated with operating an array of resistive memory cells in accordance with a number of embodiments of the present disclosure. Table 301 illustrates voltages applied to various portions of an array, such as the array described in FIGS. 2A, 2B, and 2C, in association with performing a number of memory cell operations 320-1, 320-2, 322-1, 322-2, 322-3, 324-1, 324-2, and 324-3. For instance, table 301 illustrates voltages applied to a target word line (e.g., 202-1_1), a target select line (e.g., 208-2), a target bit line (e.g., 204-2), an adjacent word line (e.g., 202-1_0), an isolation line (e.g., 203-1) an adjacent select line (e.g., 208-1), unselected bit lines (e.g., 204-1 and 204-3), unselected word lines (e.g., 202-2_0 and 202-2_1), and an unselected isolation line (e.g., 203-2) in association with various cell operations.

Operation 320-1 of table 301 can be a read operation. In this example, operation 320-1 includes deactivating the isolation device associated with a target cell by grounding the isolation line. Operation 320-1 includes applying a first voltage to the target word line, a second voltage to a target select line and to unselected bit lines, and a third voltage (e.g., a ground voltage) to a target bit line, an adjacent word line, an isolation line, an adjacent select line, unselected word lines, unselected isolation lines. The first voltage can be a supply voltage Vcc and the second voltage can be a read voltage.

For example, the target cell being associated with operation 320-1 can be the cell at the intersection of bit line 204-2 and word line 202-1_1 shown in FIG. 2A. As an example, a supply voltage (e.g., Vcc) can be applied to the target word line 202-1_1 and a read voltage can applied to the target select line 208-2 and also to unselected bit lines 204-1 and 204-3. The target bit line 204-2 can be grounded along with adjacent word line 202-1_0, isolation line 203-1, adjacent select line 208-1, unselected word lines 202-20 and 202-2_1, and unselected isolation line 203-2.

Operation 320-2 of table 301 can be a read operation. In a number of embodiments, read operations can be performed in either polarity. For example, operation 320-1 can be a read operation performed in a positive polarity and operation 320-2 can be a read operation performed in a negative polarity. In this example, operation 320-2 includes deactivating the isolation device associated with a target cell by grounding the isolation line. Operation 320-2 includes applying a first voltage to a target word line, a second voltage to a target bit line, and a third voltage (e.g., a ground voltage) to a target select line, an adjacent word line, an isolation line, an adjacent select line, unselected bit lines, unselected word lines, unselected isolation lines. The first voltage can be Vcc and the second voltage can be a read voltage.

For example, the target cell associated with operation 320-2 can be the cell at the intersection of bit line 204-2 and word line 202-1_1 shown in FIG. 2A. As an example, a supply voltage (e.g., Vcc) can be applied to the target word line 202-1_1 and a read voltage can applied to the target bit line 204-2. The target select line 208-2 can be grounded along with adjacent word line 202-1_0, isolation line 203-1, adjacent select line 208-1, unselected word lines 202-20 and 202-2_1, unselected bit lines 204-1 and 204-3 and unselected isolation line 203-2.

Operation 322-1 of table 301 can be a set operation. Operation 322-1 represents a set operation performed in a 1T1R mode. That is, operation 322-1 can include grounding the isolation device (e.g., by grounding the isolation line). Operation 322-1 can include applying a first voltage to a target word line, a second voltage to a target select line and to an unselected bit line, and a third voltage (e.g., a ground voltage) to a target bit line, an adjacent word line, an adjacent select line, unselected word lines, and unselected isolation lines. The first voltage can be Vhigh (e.g., a voltage sufficient to activate access devices to which it is applied) and the second voltage can be a set voltage.

For example, the target cell associated with operation 322-1 can be the cell at the intersection of bit line 204-2 and word line 202-1_1 shown in FIG. 2A. As an example, an access device activation voltage (e.g., Vhigh) can be applied to the target word line 202-1_0_1 and a set voltage can be applied to the target select line 108-2 and also to unselected bit lines 204-1 and 204-3. The target bit line 204-2 can be grounded along with adjacent word line 202-1_0, isolation line 203-1, adjacent select line 108-1, unselected word lines 202-2_0 and 202-2_1, and unselected isolation line 203-2.

Operation 322-2 of table 301 can be a set operation. Operation 322-2 can represent a set operation performed in a 1.5T1R mode. As such, operation 322-2 includes activating the isolation device by applying an access device activation voltage to the isolation line. Therefore, during the operation 322-2, current passes through two access devices, with one access device passing the full set current and the other access device passing a partial set current. Operation 322-2 can be the default set operation for an array of memory cells and/or may only be applied in certain circumstances, such as when performing a set operation on memory cells having high current tail-bits (e.g., memory cells requiring a higher than usual set current due to random and/or systematic variations of the manufacturing process, among other reasons).

Operation 322-2 includes applying a first voltage to a target word line, to an adjacent word line, and to an isolation line. A second voltage is applied to a target select line and a third voltage is applied to an adjacent select line and to unselected bit lines. The third voltage can be equal to a portion of the second voltage. The third voltage is provided to an adjacent select line and to unselected bit lines, which can reduce the voltage disturb experienced by memory cells near the target memory cell. The first voltage can be an access device activation voltage, such as Vhigh, and the second voltage can be a set voltage. A fourth voltage, such as a ground voltage, can be applied to the target bit lines, unselected word lines, and unselected isolation lines.

For example, the target cell associated with operation 322-2 can be the cell at the intersection of bit line 204-2 and word line 202-1_1 in shown FIG. 2A. As an example, an access device activation voltage (e.g., Vhigh) can be applied to the target word line 202-1_0_1, the adjacent word line 202-1_0, and isolation line 203-1. A set voltage can applied to the target select line 208-2 and a partial set voltage can be applied to adjacent select line 208-1 and to unselected bit lines 204-1 and 204-3. The partial set voltage associated with the set operation 322-2 applied to adjacent select line 208-1 and unselected bit lines 204-1 and 204-3 can be half of the set voltage applied to the target select line 208-2 (e.g., ½ Vset), among other partial set voltages. The target bit line 204-2 can be grounded along with unselected word lines 202-2_0 and 202-2_1 and unselected isolation line 203-2.

Operation 322-3 of table 301 can be a set operation. Operation 322-3 can represent a set operation performed in a 1.5T1R mode. As such, operation 322-3 includes activating the isolation device by applying an access device activation voltage to the isolation line. Therefore, during the operation 322-3, current passes through two access devices, with one access device passing the full set current and the other access device passing a partial set current. Operation 322-3 can be the default set operation for an array of memory cells and/or may only be applied in certain circumstances, such as when performing a set operation on memory cells having high current tail-bits (e.g., memory cells requiring a higher than usual set current due to random and/or systematic variations of the manufacturing process, among other reasons).

Operation 322-3 includes applying a first voltage to a target word line, to an adjacent word line, and to an isolation line. A second voltage is applied to a target select line and a third voltage is applied to an adjacent select line and a fourth voltage is applied to unselected bit lines. The third voltage can be equal to a portion of the second voltage and the fourth voltage can be equal to a portion of the second voltage. The third voltage is applied to an adjacent select line and the fourth voltage is applied to unselected bit lines, which can reduce the voltage disturb experienced by memory cells near the target memory cell. The first voltage can be an access device activation voltage, such as Vhigh, and the second voltage can be a set voltage. A fifth voltage, such as a ground voltage, can be applied to the target bit line, unselected word lines, and unselected isolation word lines.

For example, the target cell associated with operation 322-3 can be the cell at the intersection of bit line 204-2 and word line 202-1_1 shown in FIG. 2A. As an example, an access device activation voltage (e.g., Vhigh) can be applied to the target word line 202-1_1, the adjacent word line 202-1_0, and isolation line 203-1. A set voltage can applied to the target select line 208-2 and a first partial set voltage can be applied to adjacent select line 108-1 and a second partial set voltage can be applied to unselected bit lines 204-1 and 204-3. The first partial set voltage in the third set operation applied to adjacent select line 108-1 can be ⅓ of the set voltage applied to the target select line 208-2 and the second partial set voltage in the third set operation applied to unselected bit lines 204-1 and 204-3 can be ⅔ of the set voltage applied to the target select line 208-2, among other partial set voltages. The target bit line 204-2 can be grounded along with unselected word lines 202-2_0 and 202-2_1 and unselected isolation line 203-2.

Operation 324-1 of table 301 can be a reset operation. Operation 324-1 represents a reset operation performed in a 1T1R mode. That is, operation 324-1 can include grounding the isolation device (e.g., by grounding the isolation line). Operation 324-1 can include applying a first voltage to a target word line, a second voltage to a target bit line, and a third voltage (e.g., a ground voltage) to target select line, an adjacent word line, an adjacent select line, unselected bit lines, unselected word lines, and unselected isolation lines. The first voltage can be an access device activation voltage, such as Vhigh, and the second voltage can be a reset voltage.

For example, the target cell associated with operation 324-1 can be the cell at the intersection of bit line 204-2 and word line 202-1_1 shown in FIG. 2A. As an example, an access device activation voltage (e.g., Vhigh) can be applied to the target word line 202-1_1 and a reset voltage can applied to the target bit line 204-2. The target select line 208-2 can be grounded along with adjacent word line 202-1_0, isolation line 203-1, adjacent select line 208-1, unselected word lines 202-2_0 and 202-2_1, unselected bit lines 204-1 and 204-3 and unselected isolation line 203-2.

Operation 324-2 of table 301 can be a reset operation. Operation 324-2 can represent a reset operation performed in a 1.5T1R mode. As such, operation 324-2 includes activating the isolation device by applying an access device activation voltage to the isolation line. Therefore, during the operation 324-2, current passes through two access devices, with one access device passing the full reset current and the other access device passing a partial reset current. Operation 324-2 can be the default reset operation for an array of memory cells and/or may only be applied in certain circumstances, such as when performing a reset operation on memory cells having high current tail-bits (e.g., memory cells requiring a higher than usual set current due to random and/or systematic variations of the manufacturing process, among other reasons).

Operation 324-2 includes applying a first voltage to a target word line, to an adjacent word line, and to an isolation line. A second voltage is applied to a target bit line and a third voltage is applied to an adjacent select line and to unselected bit lines. The third voltage can be equal to a portion of the second voltage. The third voltage is applied to an adjacent select line and to unselected bit lines, which can reduce the voltage disturb experienced by memory cells near the target memory cell. The first voltage can be an access device activation voltage, such as Vhigh, and the second voltage can be a reset voltage. A fourth voltage, such as a ground voltage, can be applied to the target bit lines, unselected word lines, and unselected isolation lines.

For example, the target cell associated with reset operation 324-2 can be the cell at the intersection of bit line 204-2 and word line 202-1_1 shown in FIG. 2A. As an example, an access device activation voltage (e.g., Vhigh) can be applied to the target word line 202-1_1, the adjacent word line 202-1_0, and isolation line 203-1. A reset voltage can be applied to the target bit line 204-2 and a partial reset voltage can be applied to adjacent select line 208-1 and unselected bit lines 204-1 and 204-3. The partial reset voltage associated with the operation 324-2 applied to adjacent select line 208-1 and unselected bit lines 204-1 and 204-3 can be half of the reset voltage applied to the target bit line 204-2, among other partial set voltages. The target select line 208-2 can be grounded along with unselected word lines 202-2_0 and 202-2_1 and unselected isolation line 203-2.

Operation 324-3 of table 301 can be a reset operation. Operation 324-3 can represent a reset operation performed in a 1.5T1R mode. As such, operation 324-3 includes activating the isolation device by applying an access device activation voltage to the isolation line. Therefore, during the operation 324-3, current passes through two access devices, with one access device passing the full reset current and the other access device passing a partial reset current. Operation 324-3 can be the default reset operation for an array of memory cells and/or may only be applied in certain circumstances, such as when performing a reset operation on memory cells having high current tail-bits (e.g., memory cells requiring a higher than usual set current due to random and/or systematic variations of the manufacturing process, among other reasons).

Operation 324-3 includes applying a first voltage to a target word line, to an adjacent word line, and to an isolation line. A second voltage is applied to a target bit line, a third voltage is applied to an adjacent select line, and a fourth voltage is applied to unselected bit lines. The third voltage can be equal to a portion of the second voltage and the fourth voltage can be equal to a portion of the second voltage. The third voltage is applied to an adjacent select line and the fourth voltage is applied to unselected bit lines, which can reduce the voltage disturb experienced by memory cells near the target memory cell. The first voltage can be an access device activation voltage, such as Vhigh, and the second voltage can be a reset voltage. A fifth voltage, such as a ground voltage, can be applied to the target bit lines, unselected word lines, and unselected isolation lines.

For example, the target cell associated with operation 324-3 can be the cell at the intersection of bit line 204-2 and word line 202-1_1 shown in FIG. 2A. As an example, an access device activation voltage (e.g., Vhigh) can be applied to the target word line 202-1_1, the adjacent word line 202-1_0, and isolation line 203-1. A reset voltage can applied to the target bit line 204-2 and a first partial reset voltage can be applied to adjacent select line 108-1 and a second partial reset voltage can be applied to unselected bit lines 204-1 and 204-3. The first partial reset voltage in the third reset operation applied to adjacent select line 108-1 can be ⅓ of the reset voltage applied to the target bit line 204-2 and the second partial reset voltage in the third reset operation applied to unselected bit lines 204-1 and 204-3 can be ⅔ of the reset voltage applied to the target bit line 204-2, among other partial set voltages. The target select line 208-2 can be grounded along with unselected word lines 202-2_0 and 202-2_1 and unselected isolation line 203-2.

Figure 4:
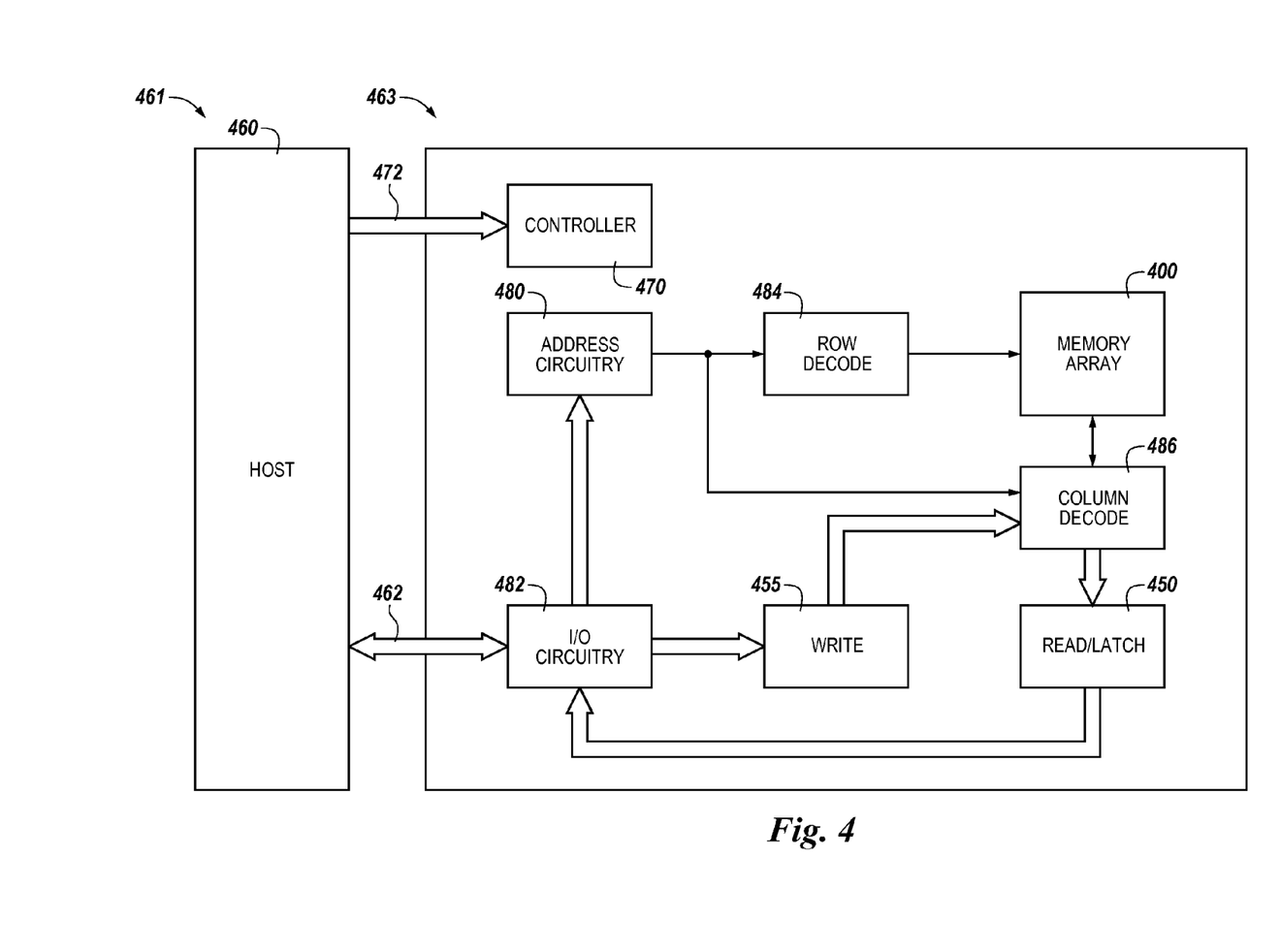
FIG. 4 illustrates a block diagram of an apparatus in the form of an electronic memory system having a memory device operated in accordance with a number of embodiments of the present disclosure.

FIG. 4 illustrates a block diagram of an apparatus in the form of an electronic memory system 461 having a memory device 463 operated in accordance with a number of embodiments of the present disclosure. The memory system 461 includes a host 460 (e.g., a number of processors, a computing device including a number of processors, and/or an application specific integrated circuit (ASIC), etc.), coupled to the memory device 463, which can itself be considered an "apparatus". The memory device 463 includes a memory array 400. The memory array 400 can be analogous to the memory array 200 previously described in connection with FIG. 2A. Although one memory array 200 is shown in FIG. 2A, embodiments of the present disclosure are not so limited.

The array 400 of memory device 463 can include, for example, resistive memory cells, as previously described herein. The memory device 463 includes address circuitry 480 to latch address signals provided over I/O connections 462 through I/O circuitry 482. Address signals are received and decoded by a row decoder 484 and a column decoder 486 to access the memory array 400.

The memory device 463 includes a controller 470 (e.g., control circuitry) coupled to the memory array 400. The controller 470 can be configured to perform operations such as set operations, reset operations, and read operations on memory cells in accordance with one or more embodiments described herein.

The memory device 463 includes read/latch circuitry 450 and write circuitry 455 that can be used by controller 470 to perform various operations on array 400.

The controller 470 decodes signals provided by control connections 472 from the host 460. These signals can include chip signals, write enable signals, and address latch signals that are used to control the operations on the memory array 400, including data sensing, data write, and data erase operations, as described herein. In a number of embodiments, the controller 470 is responsible for executing instructions from the host 460 to perform the operations according to embodiments of the present disclosure. The controller 470 can be a state machine, a sequencer, or some other type of controller. It will be appreciated by those skilled in the art that additional circuitry and control signals can be provided, and that the memory device detail of FIG. 4 has been reduced to facilitate ease of illustration.

CONCLUSION

The present disclosure includes methods and apparatuses that include resistive memory. A number of embodiments include a first memory cell coupled to a data line and including a first resistive storage element and a first access device, a second memory cell coupled to the data line and including a second resistive storage element and a second access device, an isolation device formed between the first access device and the second access device, a first select line coupled to the first resistive storage element, and a second select line coupled to the second resistive storage element, wherein the second select line is separate from the first select line.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating an array of resistive memory cells, comprising:
applying a first signal to a selected data line coupled to a first memory cell and a second memory cell, wherein the first memory cell includes a first resistive storage element and a first access device, and wherein the second memory cell includes a second resistive storage element and a second access device; and
applying a second signal to a conductive line coupled to an isolation device formed between the first access device and the second access device;
applying a third signal to a first select line coupled to the first resistive storage element;
applying a fourth signal to a second select line coupled to the second resistive storage element;
applying a fifth signal to a selected conductive line coupled to the first access device;

applying a sixth signal to a conductive line coupled to the second access device; and applying a seventh signal to unselected data lines of the array.

2. The method of claim 1, wherein applying the fifth signal includes applying a supply voltage; applying the third signal and the seventh signal includes applying a read voltage; and applying the first signal, the second signal, the fourth signal, and the sixth signal includes applying a ground voltage.

3. The method of claim 1, wherein applying the fifth signal includes applying a supply voltage; applying the first signal includes applying a read voltage; and applying the second signal, the third signal, the fourth signal, the sixth signal, and the seventh signal includes applying a ground voltage.

4. The method of claim 1, wherein applying the fifth signal, the sixth signal, and the second signal includes applying an access device activation voltage;
applying the third signal includes applying a set voltage; applying the fourth signal includes applying a first partial set voltage; applying the seventh signal includes applying a second partial set voltage; and applying the first signal includes applying a ground voltage.

5. The method of claim 4, wherein the first partial set voltage is half of the set voltage and the second partial set voltage is half of the set voltage.

6. The method of claim 4, wherein the first partial set voltage is ⅓ of the set voltage and the second partial set voltage is ⅔ of the set voltage.

7. The method of claim 1, wherein applying the fifth signal, the sixth signal, and the second signal includes applying an access device activation voltage; applying the first signal includes applying a reset voltage; applying the fourth signal includes applying a first partial reset voltage; applying the seventh signal includes applying a second partial reset voltage; and applying the third signal includes applying a ground voltage.

8. The method of claim 7, wherein the first partial reset voltage is half of the reset voltage and the second partial reset voltage is half of the reset voltage.

9. The method of claim 7, wherein the first partial reset voltage is ⅔ of the reset voltage and the second partial reset voltage is ⅓ of the reset voltage.

10. The method of claim 1, wherein applying the fifth signal includes applying an access device activation voltage; applying the third signal and the seventh signal includes applying a set voltage; and applying the first signal, the second signal, the fourth signal, and the sixth signal includes applying a ground voltage.

11. The method of claim 1, wherein applying the fifth signal includes applying an access device activation voltage; applying the first signal includes applying a reset voltage; and applying the second signal, the third signal, the fourth signal, the sixth signal, and the seventh signal includes applying a ground voltage.

12. A method of operating a resistive memory device, comprising:
applying a first voltage to a selected data line coupled to a first memory cell and a second memory cell, wherein the first memory cell includes a first resistive storage element and a first access device, and wherein the second memory cell includes a second resistive storage element and a second access device; and
applying a reference voltage to a conductive line coupled to an isolation device formed between the first access device and the second access device when operating the resistive memory apparatus in a first mode;
applying a third voltage to a first select line coupled to the first resistive storage element;
applying a fourth voltage to a second select line coupled to the second resistive storage element;
applying a fifth voltage to a selected conductive line coupled to the first access device;
applying a sixth voltage to a conductive line coupled to the second access device; and
applying a seventh voltage to unselected data lines of the array.

13. The method of claim 12, wherein the first mode of operation is a default mode of operation.

14. The method of claim 12, wherein the method includes applying an access device activation voltage to the conductive line coupled to the isolation device formed between the first access device and the second access device when operating the resistive memory apparatus in a second mode.

15. The method of claim 14, wherein applying the fourth voltage includes applying a portion of the third voltage and applying the seventh voltage includes applying a portion of the third voltage.

16. The method of claim 14, wherein applying the fourth voltage includes applying a portion of the first voltage and applying the seventh voltage includes applying a portion of the first voltage.

17. The method of claim 14, wherein the method includes operating the resistive memory apparatus in the second mode on memory cells having high current tail-bits.

18. An apparatus, comprising:
an array of memory cells; and
a controller configured to:
apply a first signal to a selected data line coupled to a first memory cell and a second memory cell, wherein the first memory cell includes a first resistive storage element and a first access device, and wherein the second memory cell includes a second resistive storage element and a second access device; and
apply a second signal to a conductive line coupled to an isolation device formed between the first access device and the second access device;
apply a third signal to a first select line coupled to the first resistive storage element;
apply a fourth signal to a second select line coupled to the second resistive storage element;
apply a fifth signal to a selected conductive line coupled to the first access device;
apply a sixth signal to a conductive line coupled to the second access device; and
apply a seventh signal to unselected data lines of the array.

19. The apparatus of claim 18, wherein the fifth signal, the sixth signal, and the second signal is an access device activation voltage; the third signal is a set voltage; the fourth signal is a first partial set voltage; the seventh signal is a second partial set voltage; and the first signal is a ground voltage.

20. The apparatus of claim 18, wherein the fifth signal, the sixth signal, and the second signal is an access device activation voltage; the first signal is a reset voltage; the fourth signal is a first partial reset voltage; the seventh signal is a second partial reset voltage; and the third signal is a ground voltage.

* * * * *